United States Patent [19]

Caprari

[11] Patent Number: 4,907,029
[45] Date of Patent: Mar. 6, 1990

[54] UNIFORM DEEP ULTRAVIOLET RADIANT SOURCE FOR SUB MICRON RESOLUTION SYSTEMS

[75] Inventor: Fausto Caprari, East Brunswick, N.J.

[73] Assignee: Actinic Systems, Inc., East Brunswick, N.J.

[21] Appl. No.: 230,902

[22] Filed: Aug. 11, 1988

[51] Int. Cl.$^4$ ............................................. G03B 27/54
[52] U.S. Cl. ...................................................... 355/67
[58] Field of Search ......................... 250/492.1; 355/67

[56] References Cited

U.S. PATENT DOCUMENTS

| | | | |
|---|---|---|---|
| 3,316,804 | 5/1967 | Weisglass | 355/67 |
| 3,596,083 | 7/1971 | Lovering | 355/67 X |
| 3,689,760 | 9/1972 | Stewart | 355/67 X |
| 4,682,885 | 7/1987 | Torigoe | 355/67 |
| 4,789,222 | 12/1988 | Ota et al. | 355/67 X |

FOREIGN PATENT DOCUMENTS

| | | | |
|---|---|---|---|
| 254137 | 11/1987 | Japan | 355/67 |
| 2171214 | 8/1986 | United Kingdom | 355/67 |

Primary Examiner—Donald A. Griffin
Attorney, Agent, or Firm—Arthur L. Plevy

[57] ABSTRACT

An optical system is provided for forming an effective image source of DUV radiation which is characterized by symmetry, high uniformity of ray bundle distribution, high spatial stability and high brightness. The system utilizes an elongated medium/low pressure mercury lamp which is surrounded by a large lightly diffused ellipsoidal reflector. The elongated medium/low pressure mercury source is converted by the lightly diffused ellipsoidal reflector into a large circular radiant source which becomes the effective object source of a condenser lens system. The effective object source of the ellipsoidal reflector is projected through a small diameter condenser lens system where it is reduced between six to ten times to an effective image source. The system then projects the symmetrical and spatially stable image source at the condenser conjugate to a lens system of two plano convex lenses to convert this uniform and spatially stable effective image source into a collimated beam for contact or proximity printing of DUV photoresist coated silicon or gallium arsenide wafers. A DUV objective can also be used for projection exposure on wafer steppers.

20 Claims, 1 Drawing Sheet

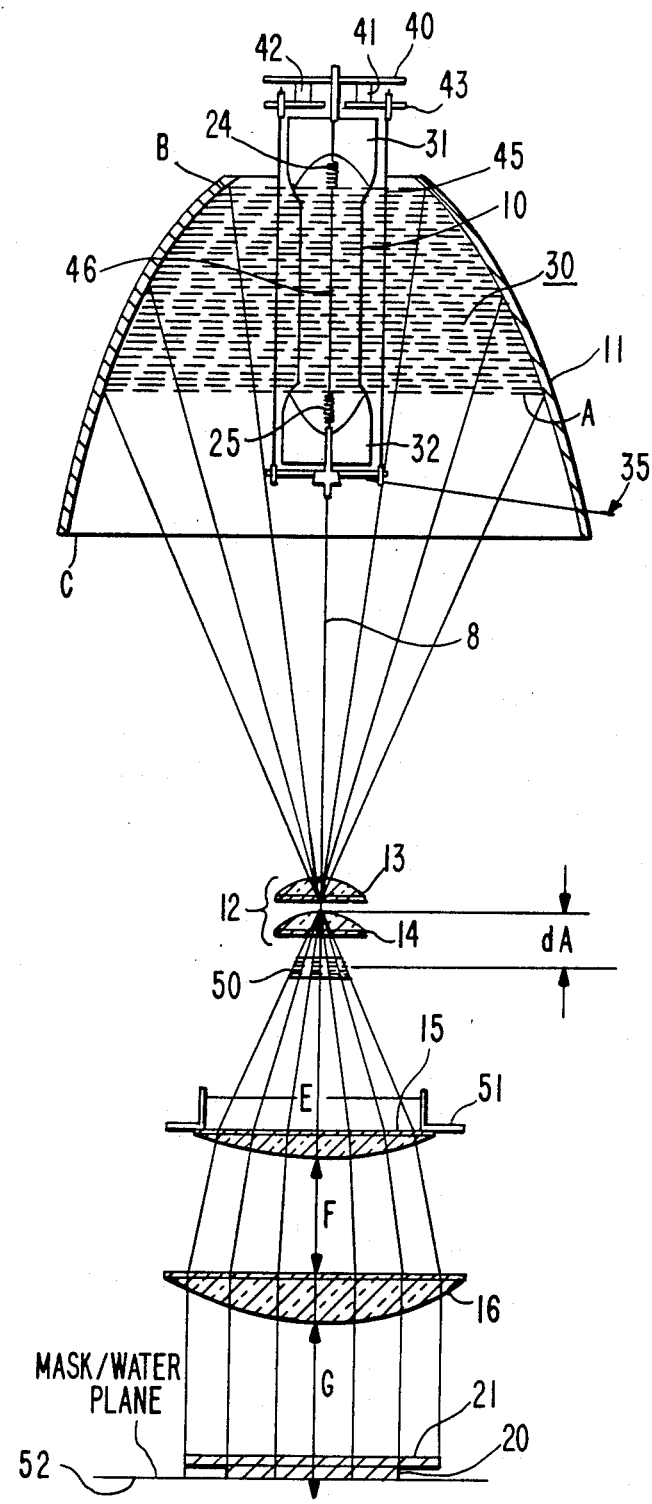

UNIFORM DEEP ULTRAVIOLET RADIANT SOURCE FOR SUB MICRON RESOLUTION SYSTEMS

BACKGROUND OF THE INVENTION

This invention relates to an optical system for providing an effective image source of deep ultraviolet radiation and more particularly to apparatus for providing a uniform deep ultraviolet radiant source for sub micron resolution photolithography.

In the field of optical exposure systems of the type employed for exposing photoresist material, as deposited on wafers in the production of integrated circuits, the mask may be positioned in close proximity to the wafer at a lens exposure plane. At that plane one desires that the light impinging upon the plane is characterized by a relatively uniform field. As indicated, many such systems exist in the prior art. For examples of suitable prior art systems and explanations of their operation, reference is made to U.S. Pat. No. 4,348,105 entitled "Radiation Shadow Projection Exposure System" issued on Sept. 7, 1982 to Fausto Caprari and assigned to the RCA Corporation. Reference is also made to U.S. Pat. No. 3,860,335 issued on Jan. 14, 1975 entitled "Optical System" to Fausto Caprari and also assigned to the RCA Corporation.

Essentially, the above noted prior art patents describe radiation systems for projecting uniform fields of irradiance to expose a photomask through a transparency in proximity to or in contact with the irradiance sensitive surface, such as a wafer or another mask. The patents describe different light sources which operate in the near and deep ultraviolet wavelength spectrum and various techniques for converting such sources into a suitable pattern which is projected on a plane containing a mask and a photoresist coated wafer.

As one can understand, as integrated circuits become more complex and operate at higher and higher frequencies, one would desire to achieve great resolution in regard to such photoresistive exposure systems whereby the resolution to be achieved will be able to distinguish between printing feature sizes of the order of 1 micrometer or less which are a function of the resist process used.

Thus the prior art has investigated the use of deep ultraviolet (DUV) lithography which employs ultraviolet radiation in the range of 200 to 300 nanometers. Hence this technology has been recognized as a promising economical technology for printing feature sizes on the order of 1 micron or less. Relative to the more exploratory X-ray or E beam technologies, deep UV lithography has the advantage of being able to retain the general configuration of conventional equipment such as the light sources, exposure/alignment optics, mask, wafer and so on, with modifications to use different materials.

Photoresist exposure systems in the prior art employ a pinpoint radiant source, a specular ellipsoidal reflector, Fly eye lens system and collimation lenses or a helical pulse xenon source in a radiation projection optical system which comprises three or four plano convex lenses.

As one will understand, during the past 20 years these systems were constantly improved to meet the demand of the semiconductor industry for higher resolution and better uniformity. Typically these photoresist exposure systems can be used for line/space resolution of 1 micrometer with low yield as a result of non-uniform ray bundles distribution. The use of a Fly eye lens system results in an apparent uniform irradiance level at the wafer plane as desired. This irradiance level, when monitored by a photodetector equipped with a cosine corrector which is insensitive to angular variations of the ray bundles across the wafer, produces such an apparent uniform level at the wafer plane as indicated. In any event, the non-uniformity of the ray bundles regarding the angular distribution across the wafers in these types of systems is the result of asymmetry, non-uniformity, and spatial instability of the radiant source.

In order to implement such requirements for DUV systems, the prior art employs high pressure pinpoint light sources. These sources contain pressurized gas at 5 atmospheres or greater. Certain of these sources employed combinations of mercury and xenon to provide a pinpoint source which are employed in microphotolithography. In any event, such light sources essentially convert 2% of the input energy to energy within the DUV range and hence such sources are relatively inefficient. Such prior art systems dictate the use of high pressure pinpoint sources as the source of illumination which source of illumination is then magnified by an amount of about 3–5 times before impinging upon the mask/wafer plane. Thus, one can understand the type of lamps utilized in these prior art systems have a relatively low conversion efficiency in the desired deep ultraviolet range.

Hence, as indicated above, the non-uniformity of the ray bundles in regard to the angular distribution across the wafer in prior art systems is the result of asymmetry, non-uniformity and spatial instability of the typical prior art radiant sources. As one can further ascertain, tests show that very uniform ray bundle distribution across the wafer is required in order to resolve submicron lines and spaces in the photoresist. Presently available commercial radiant sources are not symmetrical, uniform or spatially stable.

It is therefore an object of the present invention to provide a symmetrical, uniform and spatially stable radiant source for operation in the deep ultraviolet range and which source exhibits superior operating characteristics as compared to prior art sources.

SUMMARY OF INVENTION

An ultraviolet radiation source apparatus, comprising a source of ultraviolet illumination energy, a reflector cooperating with said source to provide an effective circular object source of a given diameter, a lens system responsive to said effective circular object source to provide an effective image source of a reduced diameter, and means responsive to said effective image source to direct said effective image source to a given target area at a given plane.

BRIEF DESCRIPTION OF FIGURE

The sole FIGURE is a schematic of a preferred embodiment of a uniform DUV radiant source for submicron resolution photolithography.

DESCRIPTION OF THE PREFERRED EMBODIMENT

As shown in the FIGURE, there is depicted a medium/low pressure mercury lamp which is a source of ultraviolet illumination. The mercury lamp 10, as will be explained, is supported by a suitable high voltage support assembly, including a heat sink and mounting rods and essentially is surrounded by a lightly diffused ellipsoidal reflector 11. The optical axis 8 of the system includes a condenser lens assembly 12 which consists of plano convex lenses 13 and 14. Aligned with the optical axis of the system is an entrance pupil plano convex lens 15 and a collimation plano convex lens 16. These components are as indicated disposed along the optical axis 8 and operate to expose a DUV photoresist coated wafer 20 through a photomask 21 at a mask/wafer plane 51.

Before explaining the operation of each of the above-described components, it is indicated that the components are positioned as shown in the FIGURE and supported with respect to the optical axis 8 in the alignment as shown in the FIGURE. The components, as for example the lens systems and so on, are supported by typical mechanical structures which structures should be obvious to those skilled in the art.

The lamp 10 is a medium/low pressure mercury lamp which is characterized by high DUV spectral emission at a peak of 253.7 namometers in wavelength. The lamp 10 is a longitudinal tubular member having a top glass flange 31 and a bottom glass flange 32 to which the electrodes 24 and 25 are directed by means of typical coupling wires. The lamp 10, as shown, is a relatively inexpensive source of radiation and is available from many different manufacturers, such as the Phillips Company, General Electric, Westinghouse and Sylvania. Such lamps, as lamp 10, are employed for street illumination and essentially are notoriously asymmetrical and highly unstable. The lamp 10, which as indicated is commercially available, operates to convert approximately 5% of its input energy or power to emissions within the DUV range between 200-300 nanometers. Thus, while the lamp is highly unsymmetrical and unstable, it is employed in conjunction with the remaining system to produce an extremely efficient radiation pattern, which pattern is ultrastable and used for submicron resolution in photolithographic systems.

Referring to the FIGURE, it is seen that there are two electrodes designated as a top electrode 24 and a bottom electrode 25. Essentially, the lamp contains mercury at a relatively low pressure which is between 1-1.5 atmospheres and an arc is sustained between electrodes 24 and 25. The distance between the electrodes 24 and 25 is approximately 3 inches with the diameter of the arc being approximately ⅛ inch. In this manner the effective ratio of the length of the arc to the width of the arc is 24:1. It is of course understood that based on manufacturing tolerances the distance between electrodes 24 and 25 may vary. In any event, as indicated above, the lamp 10 will convert approximately 5% of the input power applied to the lamp to energy within the 200-300 nanometer range or energy within the deep ultraviolet range.

As shown in the FIGURE, the lamp 10 is associated with a typical supporting structure which includes a bottom circular shield 35. The bottom circular shield 35 and combination heat sink is fabricated from a light impervious material. This circular shield 35 prevents the condensing lens system, consisting of lenses 13 and 14, from seeing or viewing the primary source which is the arc of the medium low pressure lamp 10 as directed between electrodes 24 and 25. The lamp as seen is supported at the top by a high voltage assembly which consists of an upright disc 40 separated by means of ceramic standoffs 41 and 42 from a ground return plate 43. The top assembly, which includes members 40 and 43, is coupled to the bottom assembly by means of mounting rods 45. The mounting technique and apparatus for the lamp is not considered to be important with the exception that the circular shield 35, as indicated, prevents the condenser lens asembly from viewing the primary source which is the arc of the medium low pressure mercury lamp 10.

The mercury lamp 10 mainly directs the bulk of its radiated energy perpendicular to the optical axis 8 or perpendicular to the arc path 46 between electrodes 24 and 25. As seen, the main longitudinal axis or arc supporting axis 46 of the lamp is surrounded by an ellipsoidal reflector 11.

The ellipsoidal reflector 11 has the inner surface thereof lightly diffused. The diffusion on the inner surface of the reflector is relatively conventional and can be implemented by many different techniques, as will be explained. In any event, if the inner surface of the reflector were a mirror surface, one would again see the irregularity of the lamp radiation as well as the components which serve to mount the lamp and hence one would create a poor light pattern. The slightly diffused inner surface of the reflector operates as a light emitting surface which retains the directional property of the ellipsoid reflector. Such reflectors as 11 are commercially available from many different sources. A suitable reflector is available from the Melles Griot Company of Irvine, Calif. The inner surface of the ellipsoidal reflector is coated with rhodium or some other suitable material which is electroformed on the inner surface by a suitable process. The surface is not perfectly specular and the wall of the reflector reradiates and therefore becomes a second source of light.

As shown in the FIGURE, the reflector, in conjunction with the lamp, provides an effective object source designated by reference numeral 30 and shown by the dashed line pattern which emanates from the longitudinal arc section 46 and is radiated circumferentially about the reflecting surface as shown in the FIGURE. Essentially the surface of the reflector is a relatively course scattered surface and is selected such that the light pattern on the surface, as furnished by the lamp 10, represents the light source eliminating the resolution which would otherwise reflect all irregularities associated with the source 10.

Thus because the reflector 11 is slightly diffused it operates as a spatially stable source. As indicated, due to the circular plate 35, the condensing system, consisting of lenses 13 and 14, does not see the lamp directly but sees the reflective object source 30 which is the effective object source and which is a relatively circular source.

In summation, the medium/low pressure mercury source 10 radiates mainly to that portion of the lightly diffused ellipsoidal reflector 11 between the top electrode 24 and the bottom electrode 25 of the mercury source 10. The lightly diffused inner surface of the ellipsoidal reflector 11 operates to scatter DUV radiation from the medium/low pressure mercury source 10 resulting in the formation of the effective object source 30 which is located at the object conjugate of the condenser lens system 12.

As seen, the condenser lens system 12, which consists of lenses 13 and 14, is centered about the optical axis 8. Each lens, as 13 and 14, is a plano convex lens characterized by a small diameter, as for example 38 millimeters, as compared to the large diameter of the lightly diffused ellipsoidal reflector, which is about 216 millimeters. The condensing lenses 13 and 14 have a short combined focal length of about 32 millimeters. The position of the condensing lens assembly 12 with respect to the lightly diffused ellipsoidal reflector 11, is selected to result in an effective image source 50 which is 23 millimeters in diameter and essentially is 1/7th of the effective object source diameter which is 161 millimeters.

The effective image source 50 is seen by the entrance pupil lens 15 as a uniform disc of very high brightness. The coherency factor, which is spatial rather than temporal, is equal to DS/DP where DS is the effective image source 50 diameter and DP is the entrance pupil rim 51 diameter. The coherency factor for this particular design equals 0.24. This implies that the radiant source is 76% coherent. The results of a partially coherent radiation source operate to provide improved resolution, image contrast, depth of focus, line width control, and latitude of exposure.

The plano convex entrance pupil lens 15 and the plano conex collimation lens 16 are so chosen and positioned with respect to the effective image source 50 to form a collimated beam which is characterized by uniform and stable ray bundle distribution across the wafer surface 20. The output rays from the collimating lens 16 are parallel rays which impinge upon the photomask 21 and therefore on the wafer 20.

As one can ascertain from the above description, the effective object source 30 is in fact reduced by a factor of 7 times by means of the condenser lens system 12 to provide an effective image source 50 which is substantially reduced by the factor of 7 as compared to the effective object source 30. The source 50 appears as a circular disc of extremely uniform light and at high intensity due to the subsequent reduction. The effective image source 50 impinges upon the entrance pupil lens 15 which essentially has its diameter controlled by the entrance pupil rim 51 to enable the output of the entrance pupil lens to impinge upon the collimation lens 16. The collimation lens 16 provides parallel rays at the mask/wafer plane 51 containing the photomask 21 in conjunction with the wafer 20.

While the above-described system obtained a reduction of 7 times in regard to effective image source, as compared to the effective object source, one may employ a reduction for example between 6 to 10 times and obtain the advantages described in the above-noted invention. It is immediately noted that the FIGURE is drawn to a scale whereby one centimeter equals one inch and hence the dimensions and separations of the various components as shown on the FIGURE are immediately ascertained by means of simple measuring instruments and in regard to the above-noted scale considerations.

In any event, the system operated to provide a light source for a wafer approximately 4 inches in length and width utilizing a 5×5 inch mask. The lamp as indicated has an effective arc length 46 of about 3 inches. The reflector 11 at point A has a diameter of 7 inches with a diameter of 3 inches at point B. The diameter of the reflector at the bottom or point C is 8 inches. The distance from lens 13 along the optical axis 8 to the bottom edge of the reflector is 5.5 inches. The distance designated as dA between lenses 13 and 14 and to the center of the effective image source is 1.375 inches. The effective diameter of the entrance pupil lens 15 designated by E is 3.8 inches while the effective diameter of collimation lens 16 is 5 inches. The center of lens 15 to the top edge of lens 16 is 2 inches and designated by the reference F. The distance G from the center of lens 16 to the mask plane is 2.5 inches.

The particular design shown in the FIGURE was used on a Canon mask aligner produced by the Canon Company of Japan. This system proved to resolve 3/10th of a micrometer elements with high yield in the hard contact mode. The system utilizes a Shipley PMGI DUV photoresist as supplied by the Shipley Company. Such a photoresist operates with wave lengths between 240 to 280 nanometers with a peak at 260 nanometers. As shown, all lenses are plano convex lenses and are fabricated from fused silicon glass.

Thus, as one can see from the above, the system provides submicrometer resolution for a DUV photoresist exposure sytem which system converts an elongated non-uniform and spatially unstable medium/low pressure mercury arc lamp source into a large circular radiant source which is symmetrical, uniform and spatially stable. This conversion is accomplished by a lightly diffused ellipsoidal reflector of large diameter which essentially becomes a secondary effective object source as a result of its scattering surface. This large uniform spatially stable secondary effective object source is reduced by the condenser lens system approximately 7 times utilizing a small diameter and short focal length condenser lens assembly which includes two lens elements and provides an effective image source for the radiation projection system which effective image source is located beneath the condensing lens system.

This radiation projection system than takes the effective image source as directed through two plano convex lenses and used to expose a photoresist coated wafer in contact with the photomask or a complex multielement objective and filter assembly when the system is used on wafer steppers for projection exposure. The medium/low pressure mercury lamp, which is pressurized between 1 to 1.5 atmospheres, is used because of its high conversion efficiency in the deep UV region of the spectrum (200–300 nanometers). This type of mercury lamp is normally used for street lighting and is not employed for photolithographic applications in view of its pronounced asymmetry and poor uniformity.

I claim:
1. An ultraviolet radiation source apparatus comprising:
   a mercury lamp pressurized between 1 to 1.5 atmospheres operative to support an elongated arc having a length to width ratio greater than 20;
   a reflector cooperating with said mercury lamp to provide a spatially stable, effective circular object source of a given diameter;
   a lens system responsive to said effective circular object source to provide an effective image source of a reduced diameter; and
   means responsive to said effective image source to direct said effective image source to a given target area at a given plane.
2. The apparatus according to claim 1, wherein said source is an elongated medium/low pressure mercury lamp having first and second spaced electrodes within an elongated tubular envelope for supporting an elongated arc therebetween which arc emits ultraviolet illumination energy in the deep ultraviolet region.
3. The apparatus according to claim 2, wherein said medium/low pressure is between 1 to 1.5 atmospheres.

4. The apparatus according to claim 2, wherein said elongated arc has a length to width ratio greater than 20.

5. The apparatus according to claim 1, wherein said lamp emits said ultraviolet energy in the range of 200-300 nanometers.

6. The apparatus according to claim 1, wherein said reflector is an ellipsoidal reflector having a lightly diffused inner surface, with said reflector surrounding said lamp and operative to provide said circular object source by converting said elongated arc into a circular radiation pattern.

7. The apparatus according to claim 1, wherein said lens system is a condenser lens system operative to reduce said object source by a factor between 6 to 10.

8. The apparatus according to claim 7, wherein said lens system includes first and second plano convex lenses.

9. The apparatus according to claim 1, wherein said means responsive to said effective image source includes an entrance pupil lens positioned with respect to said lens system to receive said effective image source and to provide an enlarged version of said source at the output of said entrance pupil lens and a collimation lens positioned with respect to said entrance pupil lens to receive said enlarged version to provide a collimated image therefrom which collimated image is directed to a mask/wafer plane to expose said wafer according to said mask pattern with said collimated image.

10. An optical system for providing an ultraviolet radiation pattern for photolithography, comprising:
an elongated pressurized mercury lamp operative to support an elongated arc of a given length to width ratio;
an ellipsoidal reflector symmetrically surrounding said lamp and having an inner lightly diffused surface for reflecting radiation from said lamp to provide a circular object source pattern of a given diameter symmetrically disposed about an optical system axis;
a short focal length condenser lens assembly located on said axis and adapted to receive said object source pattern to provide at an output a reduced diameter circular pattern indicative of an effective image source;
an entrance pupil lens and a collimation lens positioned along said axis and operative to provide at an output a collimated beam of high uniformity and stable ray bundles for projecting said beam to a mask/wafer plane to illuminate said mask and wafer with said beam.

11. The system according to claim 10, wherein said length to width ratio of said arc is greater than 20.

12. The system according to claim 10, wherein said lamp emits ultraviolet radiation in the range between 200-300 nanometers.

13. The system according to claim 10, wherein said object source pattern is reduced by a factor of 6-10 times.

14. The system according to claim 10, wherein said condenser lens assembly comprises two short focal length plano convex lenses.

15. The system according to claim 10, wherein said entrance pupil lens and said collimation lens are plano convex lenses.

16. The system according to claim 10, wherein said lamp is pressurized between 1-1.5 atmospheres.

17. The system according to claim 10, wherein the ratio of said effective image source diameter to the diameter of said entrance pupil lens results in a coherency factor of about 0.24.

18. The system according to claim 10, further including a circular shield member positioned along said optical axis and beneath said lamp to block light emanating from said lamp from impinging upon said condenser assembly.

19. The system according to claim 10, wherein said elongated mercury lamp is a 400 watt lamp of the type employed for street illumination and providing a highly unstable and asymmetrical light pattern.

20. An ultraviolet radiation source apparatus, comprising:
a mercury lamp pressurized between 1 to 1.5 atmospheres operating to support an elongated arc having a length to width ratio greater than 20;
an ellipsoid reflector having a lightly diffused inner surface to reflect the ultraviolet illumination energy radiated by said mercury lamp, and thereby to provide an effective circular object source of a given diameter;
a condenser lens system responsive to said effective circular object source to provide an effective image source of a diameter reduced by a factor of 6 to 10; and
means responsive to said effective image source to direct said effective image source to a given target area at a given plane.

* * * * *